United States Patent [19]

Henning

[11] Patent Number: 4,464,586
[45] Date of Patent: Aug. 7, 1984

[54] SQUARING CIRCUIT BYPASS

[75] Inventor: Jerrold V. Henning, Anaheim, Calif.

[73] Assignee: Rockwell International Corporation, El Segundo, Calif.

[21] Appl. No.: 376,480

[22] Filed: May 10, 1982

[51] Int. Cl.³ .................. H03K 19/094; H03K 5/156; H03K 3/017

[52] U.S. Cl. .................................. 307/271; 377/110; 307/572

[58] Field of Search .............. 377/108, 109, 110, 114, 377/115; 307/269, 271, 265, 571, 572

[56] References Cited

U.S. PATENT DOCUMENTS 3,202,837  8/1965  Baracket ............................ 377/110
3,548,203 12/1970  Basse et al. ........................ 377/110
3,800,233  3/1974  Sauthier ............................. 377/114
4,092,604  5/1978  Berney .............................. 307/271

Primary Examiner—John S. Heyman
Attorney, Agent, or Firm—H. Fredrick Hamann; Daniel R. McGlynn

[57] ABSTRACT

A digital signal bypass circuit including a two terminal clock input for supplying a clock input signal with a predetermined first frequency. A divide-by-two squaring circuit is also provided which is input for synchronously translating the clock input signal into an output signal having a frequency one-half of the predetermined first frequency. A bypass circuit is provided which is connected to the clock input and responsive to the clock input signal applied thereto, the bypass circuit being operative to disable the divide-by-two squaring circuit so that the output signal has a frequency equal to the predetermined first frequency.

2 Claims, 10 Drawing Figures

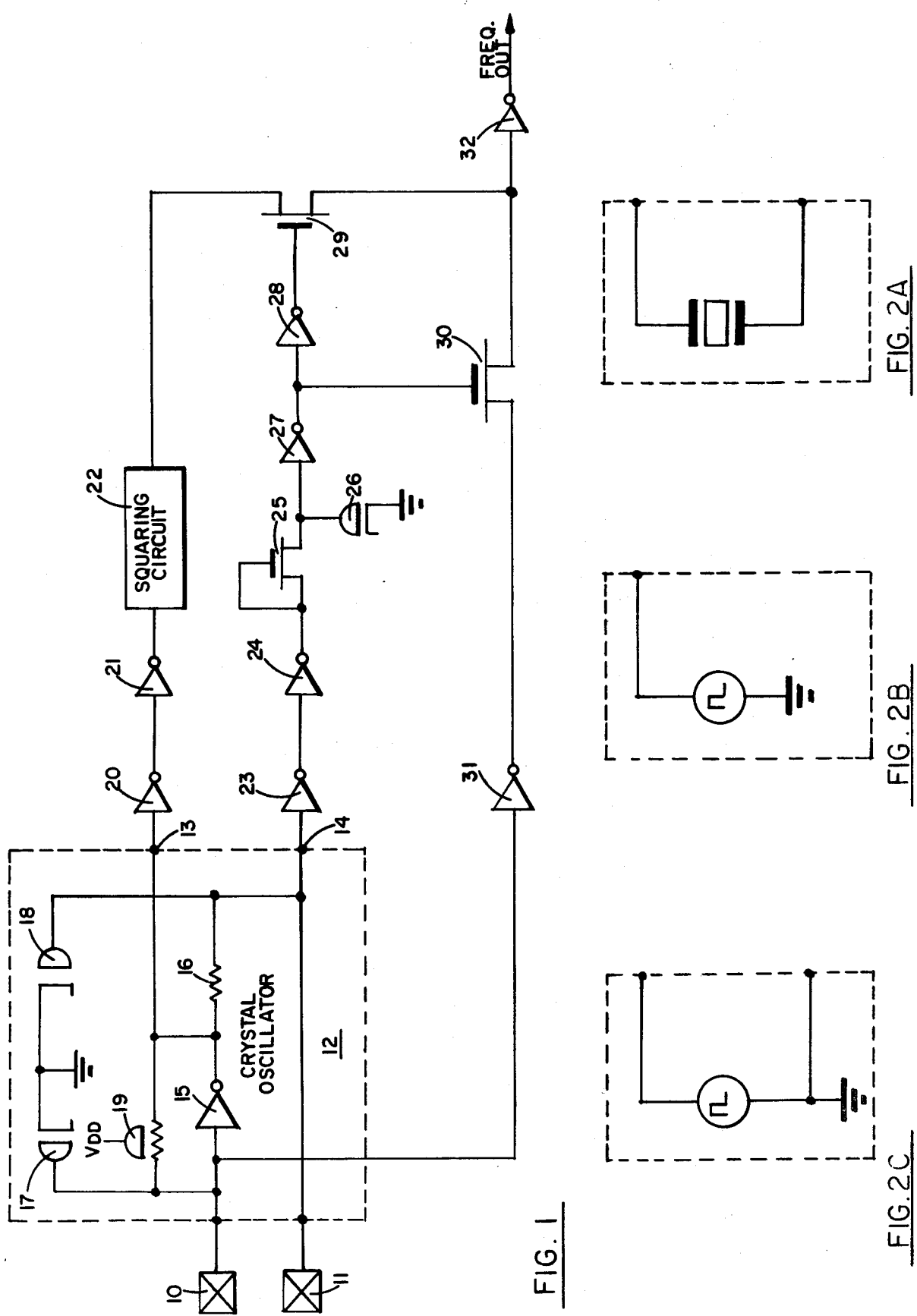

SQUARING CIRCUIT BYPASS

BACKGROUND OF THE INVENTION

1. Field of the Invention

The invention relates to bypass circuits for use in digital logic circuits, and in particular to a bypass circuit for use with a clock driver input used in integrated circuits fabricated using MOS technology.

2. Description of the Prior Art

Various types of clock driver circuits using MOS technology are known in the prior art. U.S. Pat. No. 4,250,408 describes a regulated circuit for use with a digital logic circuit which includes a sensing and regulator circuit for compensating for variations in the voltage levels, typically due to process parameter variations.

Although the above-noted patent is directed to proportionally reducing the voltage range of a clock signal applied thereto to a predetermined smaller voltage range, such circuits are not directed to the relative duration of the high level and low level portions of a clock input signal. Certain types of clocking signals applied to an integrated circuit device may have a constant predetermined frequency, but for sundry reasons the duration of the high level portion of a clock cycle may not be exactly equal to the duration of the low level portion of the clock signal. Such unequal high level and low level portions of an input clock signal may result in timing inaccuracies in various circuit components which may substantially effect the operation of the device.

The circuits of the prior art are not sufficient to handle the timing inaccuracies or variations in clocking frequency which may be due to various factors external to the integrated circuit chip under consideration. Prior to the present invention a satisfactory technique for handling such clocking variations by means internal to the integrated chip itself was not available.

SUMMARY OF THE INVENTION

Briefly, and in general terms, the invention relates to a digital signal bypass circuit that includes a squaring circuit connected to an external clock signal input. The squaring circuit translates the clock input signal into an output signal having the same frequency; however, the duration in which the output signal is at a high level is equal to the duration in which the output signal is at a low level. A divide by two circuit is also provided which is selectively connected to the input for synchronously translating the clock input signal into an output signal having a frequency one-half of the predetermined clock input frequency. A bypass circuit is provided which is operative for disabling the divide by two circuit so that the output signal may selectively have a frequency equal to the predetermined input clock frequency, or a frequency equal to one-half of predetermined input clock frequency.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWINGS

FIG. 1 is a highly simplified schematic diagram of the digital signal bypass circuit according to the present invention;

FIG. 2A illustrates a first embodiment of a digital signal frequency source which can be used as an input to the circuit shown in FIG. 1 according to the present invention;

FIG. 2B shows a second embodiment of a digital signal frequency source which can be used as an input to the circuit shown in FIG. 1 according to the present invention;

FIG. 2C shows a third embodiment of a digital signal frequency source which can be used as an input to the circuit shown in FIG. 1 according to the present invention;

DESCRIPTION OF THE PREFERRED EMBODIMENT

Figure 3A:
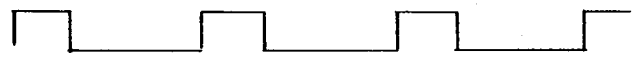
FIG. 3A shows a timing diagram associated with the frequency source shown in FIG. 2A as applied to the input of the circuit shown in FIG. 1.

The present invention is concerned with a digital circuit for providing a squaring function on an input clock signal. The output signal produced provides that the duration of the high level portion of the signal is equal to the duration of the low level portion of the signal; in other words, a square wave output signal is produced.

FIG. 1 is a schematic diagram of the digital signal bypass circuit according to the present invention fabricated using n-channel metal oxide semiconductor (MOS) field effect transistors (FET). Although a MOSFET implementation is shown by way of example to illustrate the squaring circuitry and bypass function of the present invention, it is to be understood that the present invention may be implemented in any type of digital logic or memory circuit, using any suitable semiconductor technology.

Turning most specifically to circuits shown in FIG. 1, we note that there are a first relatively positive and a second relatively negative source of fixed reference potential, labelled as $V_{DD}$, and $V_{SS}$ or ground. The typical operating reference potential $V_{DD}$ is 5 volts DC for a system fabricated using NMOS technology, while $V_{SS}$ is ground, as shown in the figure. Two external terminals 10 and 11 are provided which are used to interface the integrated circuit with either an external crystal or an external frequency source or clock input. The crystal oscillator 12 is shown connected to input terminals 10 and 11 and having output terminals 13 and 14. The crystal oscillator consists of an inverter connected to input terminal 10, resistor 16 connected in series with the inverter 15, a first depletion mode field effect capacitor 17 having its control electrode connected to the input terminal 10 and one of its conduction path electrodes connected to ground. A second depletion mode field effect capacitor 18 is also provided having a control terminal connected to one end of the resistor 16 and to the output node 14. One of the conduction path terminals of the capacitor 18 is connected to ground. Depletion mode MOSFET transistor 19 is also provided having one conduction path electrode connected to the input terminal 10 and the other conduction path electrode connected to the node between the inverter 15 and the resistor 16, as well as to the output node 13.

Turning now to the rest of the circuit outside the crystal oscillator portion, the output node 13 is connected to a first inverter 20 which is connected in turn in series to a second inverter 21 which is in turn connected in series to the squaring circuit 22. The squaring circuit 22 functions to produce a clock signal having a wave form such that the duration of the high level portion of the clock cycle is exactly equal to the duration of the low level portion of the clock cycle. The squaring circuit may alternatively perform the function of a divide-by-two, divide-by-four, or divide-by-two n operation. The squaring circuit 22 may be formed by a number of known configurations of field effect transistors and is not the subject of the present invention, so such circuits are not illustrated in detail in the drawing. The output terminal 14 is connected to inverter 23 which is in turn connected in series to inverter 24. The inverter 24 is in turn connected to one of the conduction path electrodes of an enhancement field effect transistor 25. The control terminal of the field effect transistor 25 is connected to the output of the inverter 24. The other conduction path electrode of the MOSFET 25 is connected to capacitor 26. The other end of the capacitor 26 being connected to ground. The conduction path electrode of the MOSFET 25 is also connected in series to an inverter 27 and then in series to another inverter 28. The output inverter 28 is connected to the control terminal of an enhancement mode field effect transistor 29.

The node between the inverters 27 and 28 is connected to the control electrode of a field effect transistor 30. Another inverter 31 is provided having an input connected to the input terminal 10 and the output connected to one of the conduction path electrodes of the field effect transistor 30. The other conduction path terminal of the field effect transistor 30 is connected to the input of the inverter 32.

The output of the squaring circuit 22 is connected to one of the conduction path electrodes of the enhancement mode field effect transistor 29. The other conduction path terminal of the MOSFET 29 is connected to the input of inverter 32.

The circuit described above operates as follows. The signal produced at the output of inverter 24 causes charge to be injected into the capacitor 26. The leakage paths are such that the node at the input of the inverter 27 is sufficiently positive to always exceed the positive threshold of the inverter 27 whenever an input such as shown in FIG. 2A or 2B are provided. It follows that the output of the inverter 27 is low and the output of inverter 28 is therefore asserted as a high. The signals produced by inverters 27 and 28 therefore cause MOS-FET 29 to be the same signal as the squaring circuit output signal produced by squaring circuit 22.

When the input as shown in FIG. 2C is connected to terminals 10 and 11, the output of the inverter 24 is asserted and maintained as low. As a result no charge is injected into the capacitor 26. As the charge therefore leaks off allowing the output of 27 to be asserted as high and the output of 28 as being low. As a result, the signal at the output of 30 becomes the same as the output of inverter 31. In this mode, the output frequency of the output of the inverter 32 is driven directly by the external frequency source as shown in FIG. 2C and the squaring circuit is bypassed.

FIG. 3A shows a timing diagram associated with the frequency source shown in FIG. 2A as applied to the input of the circuit shown in FIG. 1.

Figure 3B:
FIG. 3B shows the output of the circuit shown in FIG. 1 when the input used in FIG. 3A is applied thereto.

FIG. 3B shows the output of the circuit shown in FIG. 1 when the input used in FIG. 3A is applied thereto.

Figure 4A:
FIG. 4A is the timing diagram associated with the frequency source shown in FIG. 2B as applied to the input of the circuit shown in FIG. 1.

FIG. 4A is the timing diagram associated with the frequency source shown in FIG. 2B as applied to the input of the circuit shown in FIG. 2.

Figure 4B:
FIG. 4B is the output of the circuit shown in FIG. 1 when the embodiment shown in FIG. 2B having the timing diagram shown in FIG. 4A is applied thereto.

FIG. 4B is the output of the circuit shown in FIG. 1 when the embodiment shown in FIG. 2B having the timing diagram shown in FIG. 4A is applied thereto.

Figure 5A:
FIG. 5A is the timing diagram associated with the frequency source shown in FIG. 2C as applied to the input of the circuit shown in FIG. 1.

FIG. 5A is the timing diagram associated with the frequency source shown in FIG. 2C as applied to the input of the circuit shown in FIG. 1.

Figure 5B:
FIG. 5B is the output of the circuit shown in FIG. 1 when the embodiment shown in FIG. 2C having the timing diagram shown in FIG. 5A is applied thereto.

FIG. 5B is the output of the circuit shown in FIG. 1 when the embodiment shown in FIG. 2C having the timing diagram shown in FIG. 5A is applied thereto.

While the invention has been illustrated and described as embodied in a Squaring Circuit Bypass, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A MOS integrated circuit comprising:
    first and second terminals on said integrated circuit for connection to external clocking means for supplying a clock input signal to said integrated circuit having a predetermined first frequency but possibly possessing timing inaccuracies;
    a divide-by-two squaring circuit on said integrated circuit connected to said first and second terminals for synchronously translating said clock input signal into an output signal for use internally in said integrated circuit, said output signal having a frequency one-half of said predetermined first frequency, the duration in which said output signal is at a high level being equal to the duration in which said output signal is at a low level; and
    a bypass circuit on said integrated circuit connected to said first and second terminals and responsive to the clock input signal applied thereto, said bypass circuit being operative to selectively disable said divide-by-two squaring circuit so that said output signal has a frequency equal to said predetermined first frequency, said bypass circuit comprising a first inverter connected one terminal of said clock input means, a MOS field effect transistor having a first conduction path electrode connected to the output of said first inverter, and a second conduction path electrode connected to the input of a second inverter, the output of said second inverter constituting said output signal.

2. An integrated circuit as defined in claim 1, further comprising:

an oscillator circuit connected between said first and second input terminals and said squaring circuit said oscillator circuit comprising;

a first inverter connected to said first input terminal;

a resistor having a first terminal connected to the output of said first inverter, and a second terminal;

a first depletion mode field effect capacitor having a control electrode connected to said first input terminal and one of its conduction paths electrodes connected to ground potential;

A second depletion made field effect capacitor having a control electrode connected to said second terminal of said resistor and to the output node, and one of its conduction path terminals connected to ground;

a depletion mode MOSFET transistor having one conduction path electrode connected to said first input terminal, the other conduction path electrode connected to the node between the inverter and said resistor, and to said second output node;

wherein said second output node is connected to said squaring circuit;

said first output terminal connected to said first inverter, further comprising a second inverter having an input connected to said first input terminal and output connected to one of the conduction path electrodes of the field effect transistor.

* * * * *